(12) United States Patent
Zhang et al.

(10) Patent No.: US 10,670,743 B2
(45) Date of Patent: Jun. 2, 2020

(54) SEMICONDUCTOR DETECTOR AND METHOD FOR PACKAGING THE SAME

(71) Applicant: NUCTECH COMPANY LIMITED, Beijing (CN)

(72) Inventors: Lan Zhang, Beijing (CN); Yingshuai Du, Beijing (CN); Bo Li, Beijing (CN); Zonggui Wu, Beijing (CN); Jun Li, Beijing (CN); Xuepeng Cao, Beijing (CN); Haifan Hu, Beijing (CN); Jianping Gu, Beijing (CN); Guangming Xu, Beijing (CN); Bicheng Liu, Beijing (CN)

(73) Assignee: NUCTECH COMPANY LIMITED, Beijing (CN)

( * ) Notice: Subject to any disclaimer, the term of this patent is extended or adjusted under 35 U.S.C. 154(b) by 0 days.

(21) Appl. No.: 15/606,394

(22) Filed: May 26, 2017

(65) Prior Publication Data
US 2018/0059265 A1    Mar. 1, 2018

(30) Foreign Application Priority Data
Aug. 31, 2016  (CN) .......................... 2016 1 0797744

(51) Int. Cl.
*G01T 1/24*    (2006.01)
*H04N 5/378*   (2011.01)
(Continued)

(52) U.S. Cl.
CPC .............. *G01T 1/247* (2013.01); *G01T 1/241* (2013.01); *G01T 1/2928* (2013.01);
(Continued)

(58) Field of Classification Search
CPC ......... G01T 1/247; G01T 1/241; H04N 5/378; H04N 5/379; H01L 31/0296; H01L 31/085; H01L 31/1832
See application file for complete search history.

(56) References Cited

U.S. PATENT DOCUMENTS

| | | | |
|---|---|---|---|
| 7,525,098 B2 * | 4/2009 | El-Hanany | G01T 1/242 250/370.06 |
| 2008/0149844 A1 | 6/2008 | Chen et al. | |

(Continued)

FOREIGN PATENT DOCUMENTS

| | | |
|---|---|---|
| EP | 1 492 168 A1 | 12/2004 |
| WO | WO 2016/046014 A1 | 3/2016 |

OTHER PUBLICATIONS

Extended European Search Report as issued in European Patent Application No. 17173053.4, dated Jan. 3, 2018.

*Primary Examiner* — Michael C Bryant
(74) *Attorney, Agent, or Firm* — Pillsbury Winthrop Shaw Pittman LLP

(57) ABSTRACT

A semiconductor detector and a packaging method thereof. The semiconductor detector includes: a cathode circuit board including a read out chip, a high voltage side top layer of the cathode circuit board, a bottom connection layer of the cathode circuit board and a dielectric filled between the high voltage side top layer and the bottom connection layer, wherein the high voltage side top layer is connected to the bottom connection layer through a via hole; and a detector crystal including a crystal body, an anode and a cathode, the anode is connected to the read out chip of the cathode circuit board, the high voltage side top layer is connected to an input terminal of the semiconductor detector and the bottom connection layer directly contacts the cathode of the detector crystal to connect the cathode to the cathode circuit board.

18 Claims, 3 Drawing Sheets

(51) Int. Cl.
    *H04N 5/369*     (2011.01)
    *G01T 1/29*     (2006.01)
    *H01L 31/0296*     (2006.01)
    *H01L 31/08*     (2006.01)
    *H01L 31/18*     (2006.01)

(52) U.S. Cl.
    CPC ........ *H01L 31/0296* (2013.01); *H01L 31/085* (2013.01); *H01L 31/1832* (2013.01); *H04N 5/378* (2013.01); *H04N 5/379* (2018.08)

(56) References Cited

U.S. PATENT DOCUMENTS

| | | | |
|---|---|---|---|
| 2011/0193186 A1* | 8/2011 | Yu | G01T 1/242 |
| | | | 257/429 |
| 2011/0272589 A1 | 11/2011 | Yang et al. | |
| 2017/0192110 A1* | 7/2017 | Steadman Booker | G01T 1/244 |

* cited by examiner

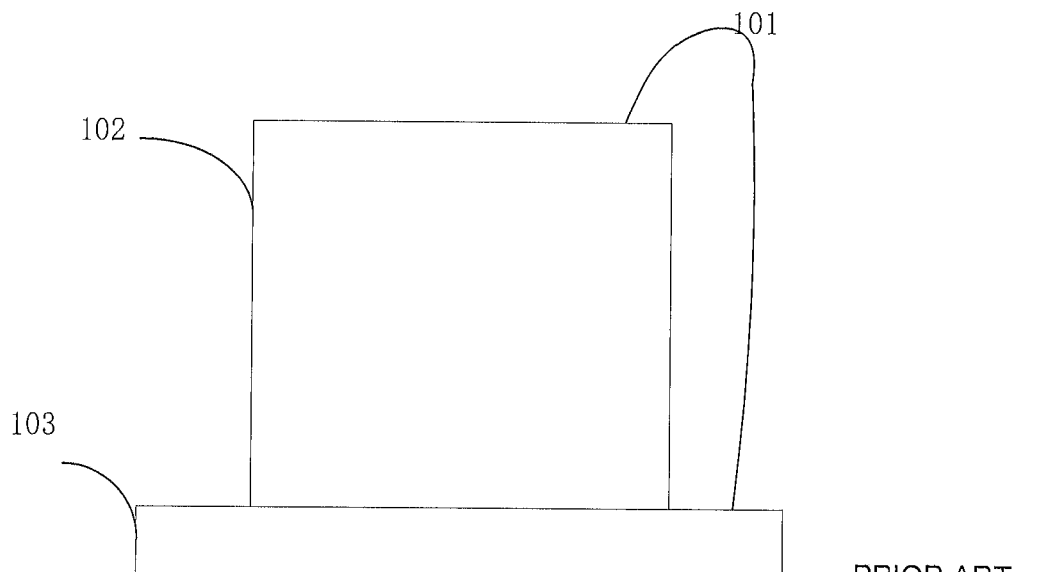
-- PRIOR ART --
Figure 1
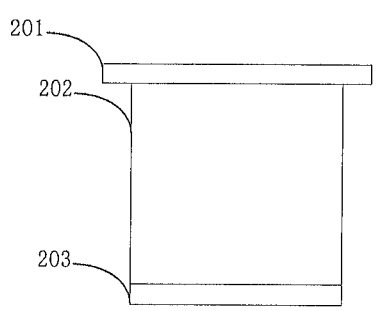 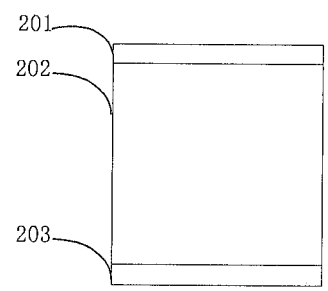 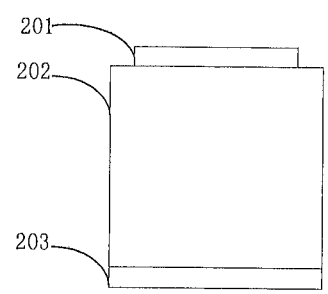
Figure 2A  Figure 2B  Figure 2C
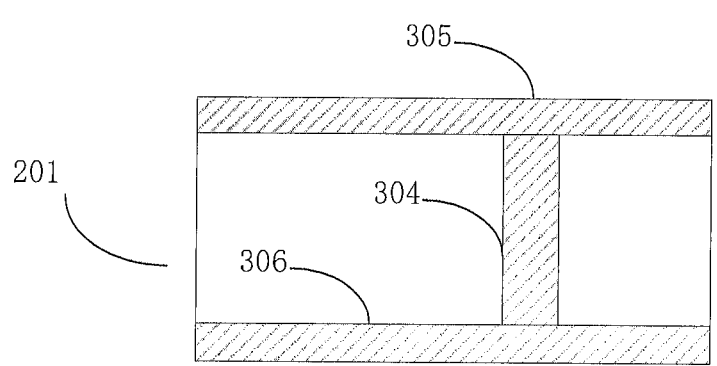
Figure 3

SEMICONDUCTOR DETECTOR AND METHOD FOR PACKAGING THE SAME

This application claims priority to Chinese Patent Application No. 201610797744.x filed Aug. 31, 2016 and titled "SEMICONDUCTOR DETECTOR AND METHOD FOR PACKAGING THE SAME", which is incorporated herein in its entirety by reference.

TECHNICAL FIELD

The present disclosure relates to a semiconductor detector, and more particularly to a tellurium-zinc-cadmium semiconductor detector and a method for packaging the same, and more particularly to a cathode package, a high-voltage connection, a high-voltage filter for a semiconductor detector and an obtained semiconductor detector.

BACKGROUND

Semiconductor detectors have been widely considered for their high detection efficiency and better energy resolution, and are applied to various applications of radiation detection such as nuclide recognizers, metering alarms, etc. in environmental radiation detection, item detection such as a goods detection machine, industrial CT (Computed Tomography) in the national security field, CT, dental imaging, PET (Positron Emission Tomography), SPECT (Single Photon Emission Computed Tomography) and so on in medical applications. There are many types of semiconductor materials, such as CdMnTe (cadmium manganese telluride), $HgI_2$ (mercury iodide), TlBr (thallium bromide), $PbI_2$ (lead iodide), GaAs (gallium arsenide), Ge (germanium) or the like, which have different characteristics and are applied to different fields.

SUMMARY

Cadmium zinc telluride (CdZnTe or CZT for short) crystal is one kind of excellent semiconductor radiation detection material at room temperature which is developed in recent years. CZT has a high resistivity, a large atomic number, and a large forbidden band width, so a detector fabricated with CZT has a small leakage current and a better energy resolution for X and y-ray at room temperature without polarization phenomenon. When the ray is incident onto the detector, it interacts with CZT to generate electrons and holes. The electrons and holes are pulled in the electric field to move towards the anode and the cathode, respectively, to generate induction signals.

In addition to its excellent energy resolution and high detection efficiency, CdZnTe works at room temperature, which is the most potential material for radiation detection. However, CZT is an expensive and fragile semiconductor material. In the existing design, the cathode is connected to high voltage wires by means of soldering or a conductive adhesive, and the high voltage wires and electrodes are exposed to air. In this way, the crystal cathode surface and the high voltage connection line may be touched during installation, resulting in the cathode surface becoming dirty and the high voltage wire being touched. Furthermore, mechanical contact can make the anode crystal break, affect the detection performance of the crystal, and even damage the detector. The method of directly connecting the high-voltage wire to the cathode surface of the detector will bring security risks and lead to short circuit or space discharge; and repeated installation will lead to a high-voltage wire to be broken and damage the detector. In a situation where a number of detectors are integrated, the high-voltage side of the detector is far away from the high voltage source, which will increase a system noise since an effective filtering can't be implemented.

FIG. 1 shows a high voltage connection of a cathode high voltage side of a traditional CZT. As shown in FIG. 1, one terminal of the high voltage wire 101 is soldered to a cathode of a detector 102, and the other terminal of the high voltage wire is soldered to a printed circuit board 103 which is packaged with the anode; or the other terminal of the high voltage wire is directly connected to the high voltage source. For such a connection, it is not convenient to connect the high voltage wire, and a suspended wire will be deformed after a long time and it is easy to touch the high voltage wire in use. Since the high voltage wire is connected to the printed circuit board 103 for the anode and the printed circuit board for the anode is larger than the detector, seamless connection of multiple detectors cannot be implemented. Since there is not any protecting means for the cathode, it is easy for the cathode to touch the detector in use, which leads to performance degradation.

The present disclosure relates to a semiconductor detector, and more particularly to a tellurium-zinc-cadmium semiconductor detector and a method for packaging the same, and more particularly to a cathode package, a high-voltage connection, a high-voltage filter for a semiconductor detector and an obtained semiconductor detector.

The present disclosure provides a semiconductor detector comprising: a cathode circuit board including a read out chip; the cathode circuit board including a high voltage side top layer of the cathode circuit board, a bottom connection layer of the cathode circuit board and a dielectric which is filled between the high voltage side top layer of the cathode circuit board and the bottom connection layer of the cathode circuit board, the high voltage side top layer of the cathode circuit board being connected to the bottom connection layer of the cathode circuit board through a via hole; and a detector crystal including a crystal body, an anode and a cathode, the anode being connected to the read out chip of the cathode circuit board, the high voltage side top layer of the cathode circuit board being connected to an input terminal of the semiconductor detector and the bottom connection layer of the cathode circuit board directly contacting the cathode of the detector crystal to connect the cathode to the cathode circuit board.

The present disclosure also provides a method for packaging a semiconductor detector comprising: a cathode circuit board including a read out chip, the cathode circuit board including a high voltage side top layer of the cathode circuit board, a bottom connection layer of the cathode circuit board and a dielectric which is filled between the high voltage side top layer of the cathode circuit board and the bottom connection layer of the cathode circuit board, the high voltage side top layer of the cathode circuit board being connected to the bottom connection layer of the cathode circuit board through a via hole; and a detector crystal including a crystal body, an anode and a cathode, the anode being connected to the read out chip of the cathode circuit board, the method comprising: connecting the high voltage side top layer of the cathode circuit board to a high voltage input terminal of the semiconductor detector; and connecting the cathode to the cathode circuit board by directly contacting the bottom connection layer of the cathode circuit board with the cathode of the detector crystal.

The method of the present disclosure may be applied to linear array detectors, pixel detectors and other semiconductor detectors.

By means of the semiconductor detector and the method for packaging the same according to the present disclosure, the high voltage end of the detector crystal may be mechanically protected to reduce a safety danger caused by the high voltage and to improve the stability of the high voltage connection. By adding the filter circuit at the nearest place to the detector, the noise caused by the high voltage may be effectively decreased to improve the performance of the detector; and by adjusting the size of the cathode and the anode circuit board, a seamless cascade of multiple detectors may be implemented.

BRIEF DESCRIPTION OF THE DRAWINGS

FIG. 1 shows the high-voltage connection of a traditional CZT cathode high-voltage terminal;

FIG. 2A, FIG. 2B and FIG. 2C each show a side view of a printed circuit board (PCB) and a detector according to an embodiment of the present invention;

FIG. 3 shows a block diagram of a PCB according to an embodiment of the present invention;

DETAILED DESCRIPTION

Figure 4:
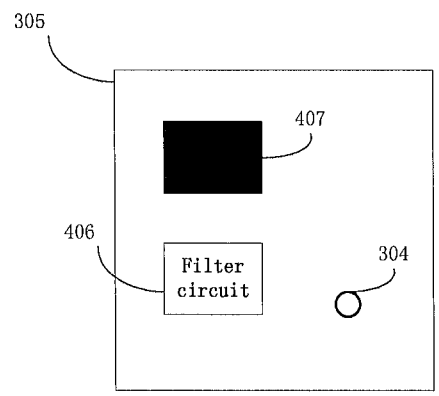
FIG. 4 shows a bottom structure diagram of the PCB according to an embodiment of the present invention.

Reference will now be made to the embodiments of the present invention, examples of which are illustrated in the accompanying drawings, wherein like reference numerals refer to similar elements throughout the drawings. The following examples of the present invention will be described with reference to the accompanying drawings.

The present disclosure directly packages a printed circuit board (PCB) to a high voltage surface of a detector. At a high voltage connection terminal of the detector, the PCB board is directly packaged to the high voltage side of the detector. The type of electrode at the high voltage terminal may be a variety of shapes such as a plan array, pixels, a strip, and so on. The PCB board utilizes a double-layer structure of top and bottom layers, which is not limited to two layers. The bottom surface is an exposed electrode, which is directly packaged with a high-voltage electrode of the detector. The top surface of the PCB board is a high voltage connection surface and a filter circuit may be added at this top surface. A high voltage is connected to the top layer of the PCB board through wires, and is filtered in the top surface to be connected to a ground of the PCB through a via hole, which may effectively prevent an anode of the detector from contacting external environment and provide good protection.

The size of the PCB may be the same as that of the crystal, or it may be larger or smaller than that of the high voltage side of the detector. The shape of the crystal may be a rectangular shape, a square shape or a cylinder. In an embodiment, the PCB has the same shape and size as that of the detector.

The present disclosure implements a connection of the high voltage source and the high voltage electrode of the detector through the PCB board. The PCB utilizes a double-layer structure (bottom layer and top layer), and may also utilize a multi-layer PCB structure. The top and bottom layers of the PCB are connected through via holes, and the number of via holes is not limited and the distribution is also not limited. Desirably, the plurality of via holes is distributed in many orientations so that the high voltage at the cathode surface of the detector may be uniformly distributed. The bottom electrode of the PCB is directly connected to the high voltage side of the detector by a conductive adhesive or other means. The top layer of the PCB board utilizes a solder patch socket, and a high-voltage connection may be made by plugging in and out a high voltage wire or direct soldering to implement the connection with the high voltage source. During such a process, it is desirable to use a flexible PCB board. The metal at the soldering points may be as low as possible to reduce the influence of the metal on top of the PCB board on the detector.

The present disclosure may implement filtering of the high voltage by adding a filter circuit on the PCB at the high voltage side, which may reduce the distance between the filter circuit and the anode. The filter circuit for filtering the high-voltage utilizes an active filtering or a passive filtering and, in an embodiment, utilizes the passive filtering. The passive filtering may reduce the distance from the filtered high voltage to the detector, and may reduce the influence caused by the long wires which may affect detection performance of the detector. When a flexible PCB is utilized to implement connection of the PCB and the high voltage source, the filter circuit is, in an embodiment, placed on the flexible PCB, and the passive filtering is preferred. In this way, the distance between the filtered high voltage and the detector is reduced. The shielding of the electronic components of the filter to the rays is decreased when the rays are incident at the cathode. When the ray is incident at the anode, the influence of the electronic components may be ignored.

In the embodiment of the present disclosure, the CZT detector is used as an example, and the size of the detector is $10*10*10$ mm$^3$. The anode of the detector is a pixel structure, which is packaged on the PCB to be connected to a readout chip. The cathode of the detector is a planar structure, and is connected to a negative high voltage. The present invention is not limited by the electrode structure of the anode, the packaging mode or the like. The present invention is not limited by the electrode structure of the cathode, and the cathode electrode may be a planar array, a coplanar gate, a linear array or the like. The present invention is not limited by the shape of the detector, and the shape may be a cuboid, a cube, a cylinder or the like. The present invention is also not limited by the material of the detector.

The present disclosure utilizes a means of directly packaging the PCB and the cathode of the detector, which protects the detector and also provides a way of effective high-voltage connection. The PCB may also utilize a variety of materials.

In an embodiment, the CZT detector has a shape of a cube. FIG. 2A-C show respective side views of the PCB and the detector according to an embodiment of the present disclosure. FIGS. 2A, 2B and 2C show side views of the device according to the present disclosure in three cases, respectively, in which a component 201 is a PCB at the high voltage side (cathode), a component 202 is a detector crystal, and a component 203 is a circuit board at the other side (anode) of the crystal. The shape and size of the PCB at the cathode side are arbitrary, that is, the shape of the component 201 may be a cylinder or a cuboid, and may be the same as or different from that of the cathode surface of the detector. The cathode and anode electrodes of the detector 202 are not marked.

FIG. 3 shows a block diagram of a PCB according to an embodiment of the present invention. Such a package structure may effectively protect the anode of the detector, and may also implement a connection of the high voltage and the cathode of the detector through the PCB. As a result of utilizing the PCB board, the cathode of the detector may be directly connected through the bottom layer of the PCB board, and the high voltage may be connected to the top layer of the PCB board through via holes. Specifically, an embodiment of the PCB board structure is shown in FIG. 3, in which a component 201 is a PCB board for detecting the high voltage side. A component 306 is a bottom layer of the PCB. A conductive material for the bottom layer of the PCB (the material may be selected from copper, etc.) may directly contact the cathode of the detector and may be connected by a conductive adhesive. A component 305 is a top layer of the PCB which is connected to the high voltage. A component 304 is a via hole which connects the bottom layer and the top layer. The number and distribution of via holes 304 are not limited. In an embodiment, there may be a plurality of via holes distributed at a variety of positions.

The semiconductor detector according to an embodiment of the present disclosure comprises: a cathode circuit board including a read out chip, the cathode circuit board including a high voltage side top layer of the cathode circuit board, a bottom connection layer of the cathode circuit board and a dielectric which is filled between the high voltage side top layer of the cathode circuit board and the bottom connection layer of the cathode circuit board, the high voltage side top layer of the cathode circuit board being connected to the bottom connection layer of the cathode circuit board through a via hole; and a detector crystal including a crystal body, an anode and a cathode, the anode being connected to the read out chip of the cathode circuit board, the high voltage side top layer of the cathode circuit board being connected to an input terminal of the semiconductor detector and the bottom connection layer of the cathode circuit board directly contacting the cathode of the detector crystal to connect the cathode to the cathode circuit board.

In an embodiment, the detector crystal is a tellurium-zinc-cadmium crystal.

In an embodiment, the bottom connection layer of the cathode circuit board may contact the cathode by a conductive adhesive.

In an embodiment, the semiconductor detector comprises a plurality of via holes which are evenly arranged.

In an embodiment, the high voltage side top layer of the cathode circuit board is connected to an external high voltage source through a solder patch socket or a direct soldering.

FIG. 4 shows a bottom structure diagram of a PCB according to an embodiment of the present invention. In particular, a bottom layer 305 of the PCB includes an opening for a via hole 304, a filter circuit 406, and a port 407. The port 407 may be soldered or may be connected by way of a socket. The port 407 may be directly connected to a high-voltage source, or may be connected for a cascade of multiple modules. Wires for cascade may use ordinary high-voltage wires, and may also use flexible PCBs. In an embodiment, the flexible PCB is used. The cascade may be a cascade of line arrays or a cascade of pixels to improve areas of the detector.

As shown in FIG. 4, in the semiconductor detector according to an embodiment of the present invention, a filter circuit is provided in the top layer of the high voltage side of the cathode circuit board. The filter circuit may utilize active filtering or a passive filtering, and, in an embodiment, utilizes the passive filtering. The passive filtering may reduce the number of elements in the filtering circuit, and may reduce the influence of heat generated by electronic devices on the performance of the detector. When elements of the passive filter circuit are selected, it should consider factors such as thermal dissipation, power consumption, materials and so on. That is to say, it needs to avoid influence on the performance of the detector and avoid excessive shielding of radiation.

The filter circuit is provided at edges of the top layer of the high voltage terminal of the cathode circuit board. By setting the high-voltage filter circuit to be the shortest distance from the anode of the detector, the influence of noise is decreased and the signal-to-noise ratio is improved. This may improve an energy resolution of the detector.

In an embodiment, the cathode circuit board is a flexible circuit board. The filter circuit is provided in the flexible circuit board. In other words, the filtering method may filter in the flexible PCB. That is to say, the high voltage source and the top layer 405 of the PCB are connected through the flexible PCB and the filter circuit is placed at a position which is the closest to a voltage connection port 407. Similarly, the filtering method may utilize an active filtering and a passive filter. The passive filtering is preferred. The passive filtering may reduce the number of elements in the filtering circuit, and may reduce the influence of heat generated by electronic devices on the performance of the detector. In this way, the shielding of the electronic components of the filter to the rays is decreased, and when the ray is incident at the anode, the shielding of the filter components to the radiation may be ignored.

Figure 5A:
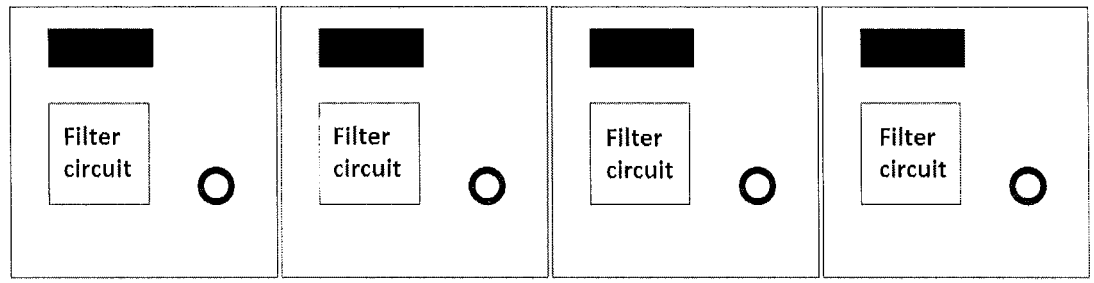
FIG. 5A and FIG. 5B each shows a schematic view (top view) of a cascade structure of a plurality of detectors according to an embodiment of the present invention.
Figure 5B:
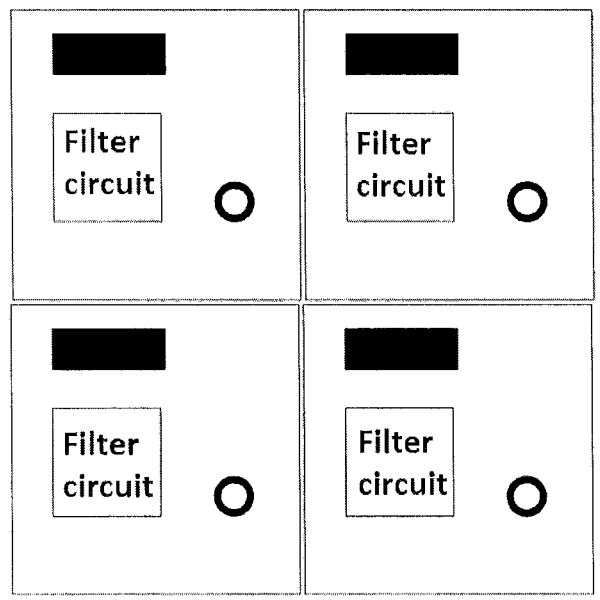

FIGS. 5A and 5B show schematic views (top views) of a cascade structure of a plurality of detectors according to an embodiment of the present invention. As shown in FIG. 5, an embodiment of the present invention enables a cascade of multiple detector modules. In the prior art, the high voltage wire is connected with the cathode of the detector and then is lead through the circuit board at the anode side of the detector, which can't implement a cascade of a plane array and there is a large gap between the cascaded detector modules. In the previous cascaded structure, the high voltage is only filtered once and then all of the detector modules are connected together. Due to lengthening of the high voltage wire, the system noise may be greatly increased. At the same time, the exposure of the high-voltage wire will bring security risks. By utilizing the cascaded structure as shown in FIG. 5A or FIG. 5B, a variety of cascades of the semiconductor detectors may be implemented.

Figure 6:
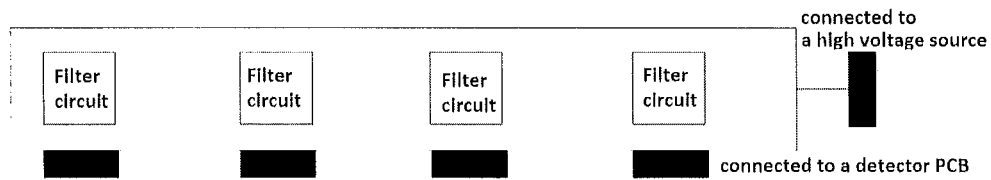
FIG. 6 shows a schematic view of providing a high voltage for multiple cascade modules through a flexible PCB.

FIG. 6 shows a schematic view of providing a high voltage for multiple cascade modules through a flexible PCB. As shown in FIG. 6, when a flexible PCB is selected as a high-voltage connection line, a width of the flexible PCB may be increased. In this case, the filter circuit may be placed on the flexible PCB to be close to ports of the PCB board for the cathode. An arrangement of the flexible PCB layout should avoid the top of the detector at the edge of the detector, thereby reducing shielding of radiation. The shape of the flexible PCB is not limited, and the flexible PCB may utilize a flexible PCB with other shapes and structures.

Figure 7:
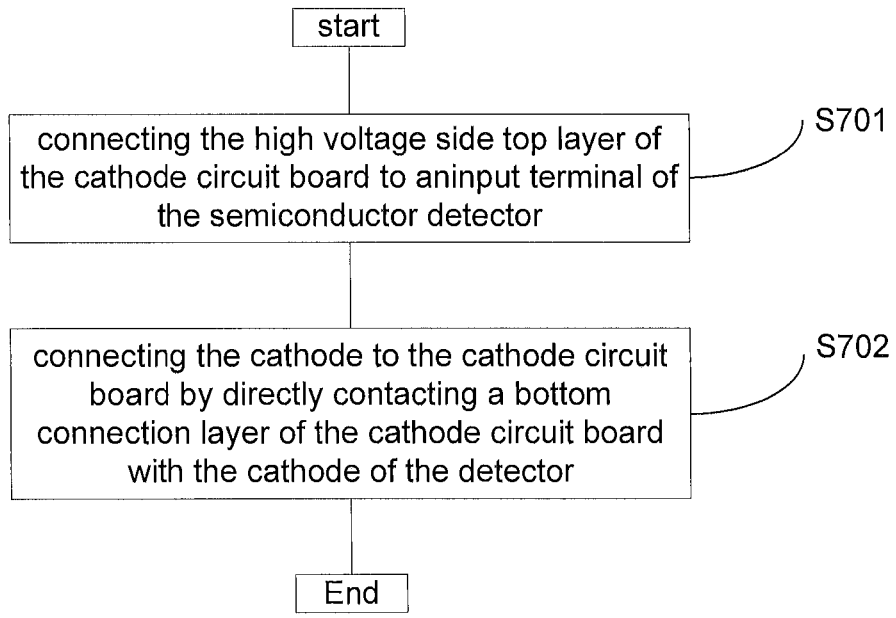
FIG. 7 shows a flow chart of a method for packaging a semiconductor detector.

FIG. 7 shows a flow chart of a method for packaging a semiconductor detector. The semiconductor detector comprises: a cathode circuit board including a read out chip, the cathode circuit board including a high voltage side top layer of the cathode circuit board, a bottom connection layer of the cathode circuit board and a dielectric which is filled between the high voltage side top layer of the cathode circuit board and the bottom connection layer of the cathode circuit board, the high voltage side top layer of the cathode circuit board being connected to the bottom connection layer of the cathode circuit board through a via hole; and a detector crystal including a crystal body, an anode and a cathode, the anode being connected to the read out chip of the cathode circuit board. The method for packaging a semiconductor detect may comprise: connecting the high voltage side top layer of the cathode circuit board to a high voltage input terminal of the semiconductor detector (S701); and connecting the cathode to the cathode circuit board by directly contacting the bottom connection layer of the cathode circuit board with the cathode of the detector crystal (S702).

In particular, a filter circuit is provided on the high voltage side top layer of the cathode circuit board to implement a filtering of the high voltage.

By means of the semiconductor detector and the method for packaging the same, the high voltage end of the detector crystal may be mechanically protected to reduce a safety danger caused by the high voltage and to improve the stability of the high voltage connection; by adding the filter circuit at the nearest place to the detector, the noise caused by the high voltage may be effectively decreased to improve the performance of the detector; and by adjusting the size of the cathode and the anode circuit board, a seamless cascade of multiple detectors may be implemented.

Although the present invention has been particularly shown and described with reference to exemplary embodiments thereof, it will be understood by those skilled in the art that various changes and modifications in form and detail may be made without departing from spirit and scope of the invention as defined by the appended claims.

We claim:

1. A semiconductor detector comprising:
    a cathode circuit board including a read out chip, a high voltage side top layer, a bottom connection layer and a dielectric filled between the high voltage side top layer and the bottom connection layer, the high voltage side top layer connected to the bottom connection layer through a via hole and coupling an input signal to the semiconductor detector; and
    a detector crystal including a crystal body, an anode, and a cathode, the anode connected to the read out chip of the cathode circuit board, and the crystal body is sandwiched between the anode and the cathode circuit board,
    wherein the bottom connection layer directly contacts the cathode of the detector crystal to connect the cathode to the cathode circuit board, and
    wherein the high voltage side top layer comprises a filter circuit.

2. The semiconductor detector according to claim 1, wherein the crystal body is a tellurium-zinc-cadmium crystal.

3. The semiconductor detector according to claim 1, wherein the bottom connection layer contacts the cathode by a conductive adhesive.

4. The semiconductor detector according to claim 1, wherein the filter circuit utilizes passive filtering.

5. The semiconductor detector according to claim 1, wherein the filter circuit is at an edge region of the high voltage side top layer.

6. The semiconductor detector according to claim 1, comprising a plurality of via holes which are evenly arranged.

7. The semiconductor detector according to claim 1, wherein the high voltage side top layer is connected to an external high voltage source through a solder patch socket or by direct soldering.

8. The semiconductor detector according to claim 1, wherein the cathode circuit board is a flexible printed circuit board.

9. The semiconductor detector according to claim 8, wherein the flexible printed circuit board comprises a filter circuit.

10. A method for packaging a semiconductor detector, the semiconductor detector comprising: a cathode circuit board including a read out chip, a high voltage side top layer, a bottom connection layer and a dielectric filled between the high voltage side top layer and the bottom connection layer, the high voltage side top layer connected to the bottom connection layer through a via hole; and a detector crystal including a crystal body, an anode and a cathode, the anode connected to the read out chip of the cathode circuit board, the method comprising:
    connecting the cathode to the cathode circuit board by directly contacting the bottom connection layer with the cathode of the detector crystal,
    wherein, once the cathode is connected to the cathode circuit board, the detector crystal is sandwiched between the anode and the cathode circuit board, and
    wherein the high voltage side top layer is used to couple an input signal to the semiconductor detector, and
    wherein the high voltage side top layer comprises a filter circuit to filter a high voltage.

11. The method according to claim 10, wherein the filter circuit utilizes passive filtering.

12. The method according to claim 10, wherein the filter circuit is at an edge region of the high voltage side top layer.

13. The method according to claim 10, wherein the crystal body is a tellurium-zinc-cadmium crystal.

14. The methods according to claim 10, wherein the bottom connection layer contacts the cathode by a conductive adhesive.

15. The method according to claim 10, wherein the high voltage side top layer is connected to an external high voltage source through a solder patch socket or by direct soldering.

16. The method according to claim 10, wherein the cathode circuit board is a flexible printed circuit board.

17. The method according to claim 16, wherein the flexible printed circuit board comprises a filter circuit.

18. The methods according to claim 10, wherein the cathode circuit board comprises a plurality of via holes which are evenly arranged.

* * * * *